(12) United States Patent
Kwon et al.

(10) Patent No.: US 12,402,374 B2
(45) Date of Patent: Aug. 26, 2025

(54) ELECTRONIC DEVICE INCLUDING TWO-DIMENSIONAL MATERIAL AND METHOD OF MANUFACTURING THE SAME

(71) Applicant: Samsung Electronics Co., Ltd., Suwon-si (KR)

(72) Inventors: Junyoung Kwon, Seoul (KR); Minsu Seol, Seoul (KR); Hyeonjin Shin, Suwon-si (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 569 days.

(21) Appl. No.: 17/673,239

(22) Filed: Feb. 16, 2022

(65) Prior Publication Data
US 2023/0061267 A1 Mar. 2, 2023

(30) Foreign Application Priority Data
Aug. 25, 2021 (KR) .......................... 10-2021-0112472

(51) Int. Cl.
*H10D 62/10* (2025.01)
*H10D 30/01* (2025.01)
(Continued)

(52) U.S. Cl.
CPC ......... *H10D 62/118* (2025.01); *H10D 30/031* (2025.01); *H10D 30/6713* (2025.01);
(Continued)

(58) Field of Classification Search
CPC ............. H01L 29/0665; H01L 29/1037; H01L 29/1606; H01L 29/24; H01L 29/401; H01L 29/41733; H01L 29/66742; H01L 29/78618; H01L 29/0673; H01L 29/0676; H01L 29/41725; H01L 29/45; H01L 29/66969; H01L 29/78681;
(Continued)

(56) References Cited

U.S. PATENT DOCUMENTS 7,968,674 B2  6/2011  Choi et al.
7,988,941 B2  8/2011  Choi et al.
(Continued)

FOREIGN PATENT DOCUMENTS

KR  2012/0080060 A  7/2012
KR  101900045 B1  9/2018
(Continued)

OTHER PUBLICATIONS

Google Search—dielectric layer act as gate insulating layer—Sep. 17, 2024 (Year: 2024).*
(Continued)

*Primary Examiner* — Suberr L Chi
(74) *Attorney, Agent, or Firm* — HARNESS, DICKEY & PIERCE, P.L.C.

(57) ABSTRACT

An electronic device including a two-dimensional material is provided. The electronic device may include a substrate; a metal layer on a partial region of the substrate; a two-dimensional material layer over the metal layer and an upper surface of the substrate; and an insertion layer between the metal layer and the two-dimensional material layer.

18 Claims, 13 Drawing Sheets

(51) Int. Cl.
*H10D 30/67* (2025.01)
*H10D 62/17* (2025.01)
*H10D 62/80* (2025.01)
*H10D 64/01* (2025.01)

(52) U.S. Cl.
CPC ....... *H10D 30/6729* (2025.01); *H10D 62/292* (2025.01); *H10D 62/80* (2025.01); *H10D 62/882* (2025.01); *H10D 64/01* (2025.01)

(58) Field of Classification Search
CPC ......... H01L 29/78696; H01L 29/42384; H01L 29/47; H10D 62/117–122
See application file for complete search history.

(56) References Cited

U.S. PATENT DOCUMENTS

| | | | |
|---|---|---|---|
| 8,133,466 B2 | 3/2012 | Shin et al. | |
| 8,283,038 B2 | 10/2012 | Choi et al. | |
| 8,535,553 B2 | 9/2013 | Kong et al. | |
| 8,623,761 B2 | 1/2014 | Bonilla et al. | |
| 8,723,024 B2 | 5/2014 | Choi et al. | |
| 8,895,433 B2 | 11/2014 | Bonilla et al. | |
| 8,906,787 B2 | 12/2014 | Park et al. | |
| 8,912,530 B2 | 12/2014 | Yang et al. | |
| 9,040,957 B2 | 5/2015 | Lee et al. | |
| 9,056,424 B2 | 6/2015 | Wenxu et al. | |
| 9,064,777 B2 | 6/2015 | Heo et al. | |
| 9,108,848 B2 | 8/2015 | Woo et al. | |
| 9,166,019 B2 | 10/2015 | Saito et al. | |
| 9,324,634 B2 | 4/2016 | Bao et al. | |
| 9,324,635 B2 | 4/2016 | Bao et al. | |
| 9,359,211 B2 | 6/2016 | Woo et al. | |
| 9,472,450 B2 | 10/2016 | Bonilla et al. | |
| 9,527,043 B2 | 12/2016 | Choi et al. | |
| 9,533,265 B2 | 1/2017 | Choi et al. | |
| 9,583,358 B2 | 2/2017 | Kim et al. | |
| 9,721,734 B2 | 8/2017 | Ryu et al. | |
| 10,325,987 B2 | 6/2019 | Park et al. | |
| 2011/0127471 A1 | 6/2011 | Shin et al. | |
| 2013/0059155 A1 | 3/2013 | Choi et al. | |
| 2014/0087191 A1 | 3/2014 | Chua et al. | |
| 2015/0235959 A1 | 8/2015 | Lee et al. | |
| 2016/0020280 A1* | 1/2016 | Heo | H01L 31/028 |
| 2017/0278959 A1 | 9/2017 | Then et al. | |
| 2018/0012962 A1 | 1/2018 | Yeh et al. | |

FOREIGN PATENT DOCUMENTS

| | | |
|---|---|---|
| KR | 101906635 B1 | 10/2018 |
| KR | 102097055 B1 | 4/2020 |
| WO | WO-2018/009931 A1 | 1/2018 |

OTHER PUBLICATIONS

Adrien Allain et al., 'Electrical contacts to two-dimensional semiconductors' *Nature Materials*, vol. 14, Dec. 2015, pp. 1195-1205.

I. Asselberghs et al., 'Wafer-scale integration of double gated $WS_2$-transistors in 300mm Si CMOS fab' *IEDM* 20-893-896, 2020.

Chris D. English et al., 'Improved Contacts to $MoS_2$ Transistors by Ultra-High Vacuum Metal Deposition' *NANO Letters*, vol. 16, 2016, pp. 3824-3830.

Yuan Liu et al., 'Approaching the Schottky-Mott limit in van der Waals metal-semiconductor junctions' *Nature*, vol. 557, May 2018, pp. 696-700.

Younghun Jung et al., 'Transferred via contacts as a platform for ideal two-dimensional transistors' *Nature Electronics*, vol. 2, May 2019, pp. 187-194.

Yan Wang et al., 'Van der Waals contacts between three-dimensional metals and two-dimensional semiconductors' *Nature*, vol. 568, Apr. 2019, pp. 70-74.

Hiram J. Conley et al., 'Bandgap Engineering of Strained Monolayer and Bilayer $MoS_2$' *NANO Letters*, vol. 13, 2013, pp. 3626-3630.

* cited by examiner

ELECTRONIC DEVICE INCLUDING TWO-DIMENSIONAL MATERIAL AND METHOD OF MANUFACTURING THE SAME

CROSS-REFERENCE TO RELATED APPLICATION

This application is based on and claims priority under 35 U.S.C. § 119 to Korean Patent Application No. 10-2021-0112472, filed on Aug. 25, 2021, in the Korean Intellectual Property Office, the disclosure of which is incorporated by reference herein in its entirety.

BACKGROUND

1. Field

The present disclosure relates to electronic devices including two-dimensional materials, and/or methods of manufacturing the electronic devices.

2. Description of Related Art

Two-dimensional materials, which are materials having a two-dimensional crystal structure, may have good electrical properties and may maintain high mobility without changes in properties even when the thicknesses of the two-dimensional materials are reduced to nanoscale, and thus, the two-dimensional materials may be applied to various devices. A junction portion between a two-dimensional material and a metal may have a contact resistance due to a Schottky barrier, which may be a factor in the deterioration of electron mobility.

SUMMARY

Provided are electronic devices in which a contact resistance between a two-dimensional material and a metal is lowered, and/or methods of manufacturing the electronic devices.

Additional aspects will be set forth in part in the description which follows and, in part, will be apparent from the description, or may be learned by practice of the presented embodiments of the disclosure.

According to an embodiment, an electronic device may include a substrate; a metal layer on a partial region of the substrate; a two-dimensional material layer over the metal layer and an upper surface of the substrate; and an insertion layer between the metal layer and the two-dimensional material layer.

In some embodiments, the two-dimensional material layer may include a transferable two-dimensional material.

In some embodiments, the two-dimensional material layer may include at least one of graphene, black phosphorus, or transition metal dichalcogenide (TMD).

In some embodiments, the metal layer may include a metal having a low work function or a noble metal.

In some embodiments, the insertion layer may include graphene, a-C, h-BN, or a-BN.

In some embodiments, the metal layer may include a first electrode and a second electrode spaced apart from each other on the substrate. The two-dimensional material layer may cover an upper surface of the first electrode, an upper surface of the second electrode, and an upper surface of a part of the substrate between the first electrode and the second electrode.

In some embodiments, the electronic device may further include a gate insulating layer on the two-dimensional material layer; and a gate electrode on the gate insulating layer. The two-dimensional material layer may be a channel layer.

In some embodiments, the gate insulating layer may include at least one of a high-k oxide, a silicon oxide, or a two-dimensional insulating material capable of atomic layer deposition (ALD).

In some embodiments, the metal layer may have a step with respect to a reference surface, and the two-dimensional material layer may include a first portion along the reference surface; a second portion on the metal layer; and an inclined third portion between the first portion and the second portion.

In some embodiments, the two-dimensional material layer may include a transferred two-dimensional material layer, and the third portion may correspond to a suspended portion.

In some embodiments, the electronic device may further include an upper metal layer on the two-dimensional material layer. The upper metal layer may correspond to the metal layer.

In some embodiments, the electronic device may further include a planarization layer on the substrate. The planarization layer may expose an upper surface of the metal layer. The two-dimensional material layer may extend over the metal layer and the planarization layer.

According to an embodiment, a method of manufacturing an electronic device may include forming a metal layer on a partial region of a substrate; forming an insertion layer on the metal layer; and forming a two-dimensional material layer over the metal layer and an upper surface of the substrate by a transfer process.

In some embodiments, the insertion layer may be directly grown on the metal layer by a deposition process.

In some embodiments, the method may further include forming a planarization layer on the substrate so planarization layer exposes an upper surface of the metal layer, and the two-dimensional material layer may extend over the metal layer and the planarization layer.

The method may further forming an upper metal layer on the two-dimensional material layer, wherein the upper metal layer may correspond to the metal layer.

In some embodiments, the metal layer may be formed to have a step with respect to a reference surface. The two-dimensional material layer may include a first portion along the reference surface, a second portion on the metal layer, and a third portion. The third portion may be inclined between the first portion and the second portion.

In some embodiments, the two-dimensional material layer may include a transferred two-dimensional material layer. The third portion may be a suspended portion.

In some embodiments, the method may include forming an upper metal layer on the two-dimensional material layer. The upper metal layer may correspond to the metal layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
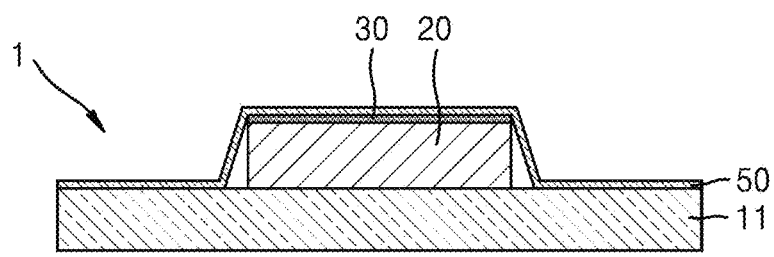
FIG. 1 is a schematic cross-sectional view illustrating an electronic device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or example terms are just used herein to describe technical ideas and should not be considered for purposes of limitation unless defined by the claims.

An electronic device according to an embodiment includes a metal layer, a two-dimensional material layer provided on the metal layer, and an insertion layer between the metal layer and the two-dimensional material layer so that the two-dimensional material layer is formed in a structure in bottom contact with the metal layer. When first and second electrodes spaced apart from each other by the metal layer are formed, and the two-dimensional material layer is provided to cover upper surfaces of the first and second electrodes and is applied as a channel layer, the electronic device according to an embodiment may be implemented as a transistor, for example, a field effect transistor, having the structure in which the two-dimensional material layer is in bottom contact with the metal layer.

In the electronic device according to an embodiment, a Fermi level pinning phenomenon that generates an energy barrier on a semiconductor surface at a junction of a metal-semiconductor may be limited and/or prevented, by forming the two-dimensional material layer in the structure in bottom contact with the metal layer.

For example, due to interfacial states caused by combining with the two-dimensional material during metal deposition, there is a limitation in that the Fermi level pinning phenomenon occurs, and a height of the Schottky barrier that determines the contact resistance does not change, even if a work function is well controlled. Meanwhile, in the electronic device according to an embodiment, a reaction between the two-dimensional material and a contact metal may be suppressed, by forming the two-dimensional material layer in the structure in bottom contact with the metal layer, and thus a Fermi level pinning effect may be reduced and/or minimized. For example, in the electronic device according to an embodiment, a metal-two-dimensional material interface without chemical bonding may be formed by transferring a two-dimensional material onto a patterned metal electrode, and thus the Fermi level pinning effect may be limited and/or minimized.

In addition, in the electronic device according to an embodiment, by providing the insertion layer between the metal layer and the two-dimensional material layer, a barrier may be lowered by controlling the work function, and the contact resistance may be further lowered by limiting and/or preventing oxidation of the metal layer. The oxidation of the metal layer may be reduced and/or minimized by depositing the insertion layer directly on a surface of the metal layer through in-situ deposition after deposition of the metal layer.

In addition, in the electronic device according to an embodiment, the oxidation of the metal layer may be limited and/or prevented, by providing the insertion layer between the metal layer and the two-dimensional material layer, and thus the metal layer may have more options for material selection. That is, various metals, such as a noble metal and a metal easily oxidized, may be used as a metal layer material.

In addition, in the electronic device according to an embodiment, oxidation of the interface of the metal layer may be limited and/or prevented, by providing the insertion layer between the metal layer and the two-dimensional material layer, so that the two-dimensional material layer may be transferred in an external environment, and also the two-dimensional material layer may be transferred in an anti-oxidation environment such as a glove box connected to a vacuum facility.

FIG. 1 is a schematic cross-sectional view illustrating an electronic device 1 according to an embodiment.

Referring to FIG. 1, the electronic device 1 may include a metal layer 20 formed in a partial region on a substrate 11, a two-dimensional material layer 50 provided over the metal layer 20 and an upper surface of the substrate 11, and an insertion layer 30 between the metal layer 20 and the two-dimensional material layer 50. The insertion layer 30 may be an anti-oxidation layer that limits and/or prevents oxidation of the metal layer 20.

The substrate 11 may be an insulating substrate, or a semiconductor substrate having an insulating layer formed on its surface. The substrate 11 may include, for example, a non-metal material such as silicon oxide, aluminum oxide, hafnium oxide, etc. The semiconductor substrate may include, for example, Si, Ge, SiGe, or a group III-V semiconductor material.

The metal layer 20 may include a metal material having excellent electrical conductivity. The metal layer 20 may include, for example, a noble metal or a metal having a low work function. The metal layer 20 may include, for example, the noble metal such as Au, Ag, Ru, Pd, or Pt. In addition, the metal layer 20 may include the metal having the low work function, such as Ti, Al, In, or Sc. In addition, the metal layer 20 may include various metals capable of being processed in a glove box or in a vacuum. Oxidation of the metal layer 20 may be limited and/or prevented, by providing the insertion layer 30 on the metal layer 20, so that the metal layer 20 may have more options for material selection, and various types of metals may be applied to the metal layer 20. That is, not only the noble metal, but also the metal having the low work function, such as Ti, Al, In, Sc, etc., having relatively strong oxidizing properties may be applied to the metal layer 20.

The insertion layer 30 may include a material that maintains or lowers the work function of the metal layer 20 formed thereunder. The insertion layer 30 may reduce a barrier by controlling the work function, and may lower a contact resistance by limiting and/or preventing the oxidation of the metal layer 20.

The insertion layer 30 may include, for example, any one material selected from graphene, amorphous carbon (a-C), h-BN, and a-BN, or may include a variety of other barrier materials. The insertion layer 30 may have a thickness equal to or less than about 5 nm, for example, equal to or less than 3 nm.

The insertion layer 30 may be directly grown on the metal layer 20 by a deposition process. The insertion layer 30 may be directly deposited on the surface of the metal layer 20, for example, through an in-situ deposition after deposition of the metal layer 20. As described above, when the insertion layer 30 is formed through the in-situ deposition after the deposition of the metal layer 20, the oxidation of the metal layer 20 may be reduced and/or minimized. For example, when the insertion layer 30 is formed by directly depositing, for example, graphene on the surface of the metal layer 20 through the in-situ deposition after the deposition of the metal layer 20, the oxidation of the metal layer 20 may be reduced and/or minimized.

Here, when the insertion layer 30 is formed through the in-situ deposition after the deposition of the metal layer 20, the oxidation of the metal layer 20 may be reduced and/or minimized, but the embodiment is not limited thereto. For example, when the metal layer 20 includes the noble metal, the insertion layer 30 may be formed through the in-situ deposition after the deposition of the metal layer 20, or through other deposition methods than the in-situ deposition.

The two-dimensional material layer 50 may include at least one of all types of transferable two-dimensional materials. In addition, the two-dimensional material layer 50 may include a transferable two-dimensional material exhibiting a semiconductor property. For example, the two-dimensional material layer 50 may include at least one of, for example, graphene, black phosphorous, or transition metal dichalcogenide (TMD).

Graphene is a material having a hexagonal honeycomb structure in which carbon atoms are two-dimensionally bonded. Compared to silicon (Si), graphene has advantage of high electrical mobility and excellent thermal properties, chemical stability, and a large surface area. Black phosphorus is a material in which black phosphorous atoms are two-dimensionally bonded. The TMD may include a compound of a transition metal and a chalcogen element. For example, the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, etc. but is not limited thereto.

In the electronic device 1 according to an embodiment, for example, the metal layer 20 may be formed on a partial region on the substrate 11, the insertion layer 30 may be formed on the metal layer 20, and the two-dimensional material layer 50 may be formed over the metal layer 20 and the upper surface of the substrate 11 by a transfer method.

As described above, in the electronic device 1 according to an embodiment, since the two-dimensional material layer 50 is formed in a structure in bottom contact with the metal layer 20, the two-dimensional material layer 50 may be transferred onto the patterned metal layer 20 to form a junction of a metal-two-dimensional material (semiconductor) without chemical bonding, and thus a Fermi level pinning effect may be reduced and/or minimized. That is, in the electronic device 1 according to an embodiment, the Fermi level pinning phenomenon that generates an energy barrier on a surface of the two-dimensional material layer 50 at the junction of the metal-two-dimensional material (semiconductor) may be limited and/or prevented.

In addition, in the electronic device 1 according to the embodiment, by providing the insertion layer 30 between the two-dimensional material layer 50 and the metal layer 20, the barrier may be lowered by controlling the work function, and the contact resistance may be lowered by limiting and/or preventing the oxidation of the metal layer 20. In addition, by providing the insertion layer 30, the oxidation of the metal layer 20 may be limited and/or prevented and a range of material selection for the metal layer 20 may be widened. The insertion layer 30 is deposited directly on the surface of the metal layer 20 through the in-situ deposition after the deposition of the metal layer 20, thereby minimizing the oxidation of the metal layer 20.

Therefore, in the electronic device 1 according to an embodiment, a contact barrier, for example, a Schottky barrier, at the junction of the metal-two-dimensional material (semiconductor) may be lowered.

Meanwhile, in the electronic device 1 according to an embodiment, the metal layer 20 may protrude from a reference surface, as shown in FIG. 1, whereby the metal layer 20 may have a step with respect to the reference surface. The reference surface may correspond to the upper surface of the substrate 11. When an insulating layer is provided on the substrate 11, the upper surface of the substrate 11 may correspond to an upper surface of the insulating layer.

As shown in FIG. 1, when the metal layer 20 protrudes from the reference surface of the substrate 11, the metal layer 20 may have a thickness, for example, equal to or greater than about 50 nm (e.g., in a range of 50 nm to 100 nm, but not limited thereto), so that a strain may be applied to the two-dimensional material layer 50 provided to cover the metal layer 20 and the upper surface of the substrate 11 by a transfer process.

As described above, when the metal layer 20 has the step with respect to the reference surface, the two-dimensional material layer 50 may include a first portion positioned along the reference surface, for example, the upper surface of the substrate 11, a second portion positioned on the metal layer 20, and a third inclined portion between the first and second portions. When the two-dimensional material layer 50 is formed by the transfer process, the third portion may be suspended.

As described above, when the metal layer 20 protrudes from the upper surface of the substrate 11, and the two-dimensional material layer 50 is formed over the metal layer 20 and the upper surface of the substrate 11 by the transfer process, the two-dimensional material layer 50 is suspended at a step portion due to a step between the metal layer 20 and the upper surface of the substrate 11, whereby the strain may be additionally applied to the two-dimensional material layer 50. The contact barrier at the junction of the metal-two-dimensional material (semiconductor) may be further lowered by the additionally applied strain.

Figure 2:
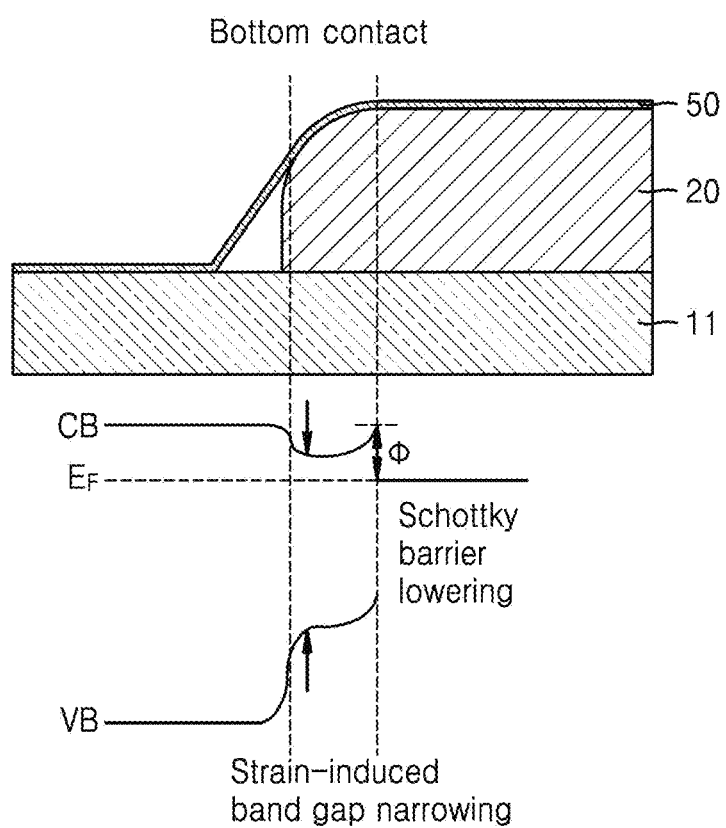
FIG. 2 shows an energy barrier at a junction of a metal-two-dimensional material (semiconductor) when a two-dimensional material layer is formed, in a structure in bottom contact with a metal layer, over the metal layer protruding from an upper surface of a substrate and the upper surface of the substrate.

FIG. 2 shows an energy barrier at a junction of a metal-two-dimensional material (semiconductor) when the two-dimensional material layer 50 is formed, in a structure in bottom contact with the metal layer 20, over the metal layer 20 protruding from the upper surface of the substrate 11 and the upper surface of the substrate 11. In FIG. 2, CB denotes a conduction band, VB denotes a valence band, Ef denotes a Fermi level, and $\varphi$ denotes a Schottky barrier.

As may be seen from FIG. 2, when the two-dimensional material layer 50 is formed in the structure in bottom contact with the metal layer 20, and a strain is additionally applied to the two-dimensional material layer 50 suspended by a step between the metal layer 20 and the upper surface of the substrate 11, the energy barrier, that is, the Schottky barrier, generated on a semiconductor surface at the junction of the metal-semiconductor may be further lowered by the strain applied to the two-dimensional material layer 50, and a bandgap may also be narrowed by the strain.

That is, in the electronic device 1 according to an embodiment, Fermi level de-pinning may be induced, by forming the two-dimensional material layer 50 in the structure in bottom contact with the metal layer 20, and thus contact barrier lowering may be obtained. In addition, a tensile strain is additionally applied to the two-dimensional material layer 50 suspended by a step between the metal layer 20 and the upper surface of the substrate 11, and thus band gap narrowing may be obtained, thereby further lowering the Schottky barrier.

In addition, in the electronic device 1 according to an embodiment, the two-dimensional material layer 50 may be formed by a transfer process, by forming the two-dimensional material layer 50 in the structure in bottom contact with the metal layer 20, and thus, a large-area integration process is possible.

Figure 3:
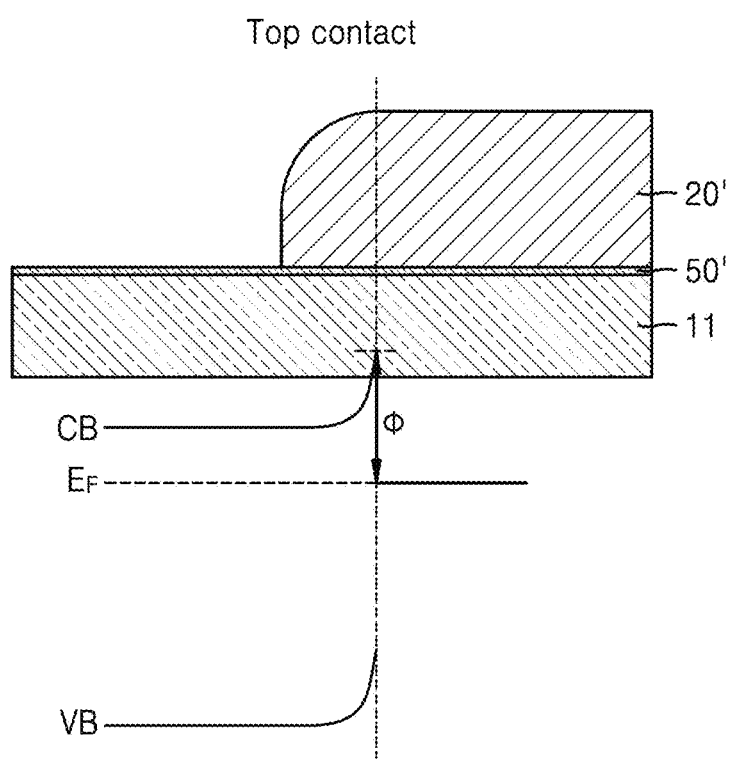
FIG. 3 shows, as a comparative example, an energy barrier at a junction of a metal-semiconductor in a structure when a two-dimensional material layer is in top contact with a metal layer.

To the contrary, as in the comparative example of FIG. 3, in a structure in which the two-dimensional material layer 50 is in top contact with the metal layer 20, when the metal layer 20 is formed by the transfer process so that the two-dimensional material layer 50 is not damaged, the large-area integration process is impossible.

FIG. 3 shows, as a comparative example, an energy barrier at a junction of a metal-semiconductor in a structure when a two-dimensional material layer 50' is in top contact with a metal layer 20'. In FIG. 3, CB denotes a conduction band, VB denotes a valence band, Ef denotes a Fermi level, and $\varphi$ denotes a Schottky barrier.

As shown in FIG. 3, it may be seen that when the two-dimensional material layer 50' has a structure in top contact with the metal layer 20', a large energy barrier, that is, a large Schottky barrier, is generated by a Fermi level pinning phenomenon that occurs at the junction of the metal-semiconductor.

Figure 4:
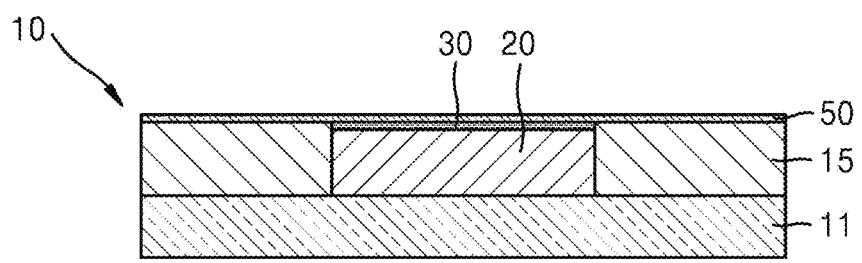
FIG. 4 is a cross-sectional view schematically showing an electronic device according to another embodiment.

Meanwhile, the electronic device 1 according to an embodiment including the metal layer 20 protruding from the upper surface of the substrate 11 has been described above as an example, but the embodiment is not limited thereto. As shown in FIG. 4, the metal layer 20 may be formed in a structure that does not protrude from the upper surface of the substrate 11.

FIG. 4 is a cross-sectional view schematically showing an electronic device 10 according to another embodiment. Compared with FIG. 1, FIG. 4 shows the two-dimensional material layer 50 provided flatly on the metal layer 20 and the substrate 11.

Referring to FIG. 4, the electronic device 10 according to an embodiment may include the metal layer 20 formed in a partial region on the substrate 11, a planarization layer 15 formed on the substrate 11 to bury the metal layer 20 so that an upper surface of the metal layer 20 is exposed, the two-dimensional material layer 50 provided flatly over the metal layer 20 and the planarization layer 15, and the insertion layer 30 between the metal layer 20 and the two-dimensional material layer 50. The same reference numeral as in FIG. 1 denote substantially the same configuration, and thus a repetitive description thereof is omitted herein.

The planarization layer 15 may include an insulating material, for example, silicon oxide. As shown in FIG. 4, the two-dimensional material layer 50 may be formed in a structure in bottom contact with the metal layer 20 and without additional strain application, by applying the planarization layer 15 burying the metal layer 20 so that the upper surface of the metal layer 20 is exposed, and forming flatly the two-dimensional material layer 50 over the metal layer 20 and the planarization layer 15 by a transfer process.

As shown in FIG. 4, when the planarization layer 15 burying the metal layer 20 is provided so that the upper surface of the metal layer 20 is exposed, the two-dimensional material layer 50 may be formed in the structure in bottom contact with the metal layer 20, even if a two-dimensional material that is easily broken by strain during the transfer process is applied as the two-dimensional material layer 50.

As shown in FIG. 4, when the planarization layer 15 burying the metal layer 20 so that the upper surface of the metal layer 20 is exposed is applied, the two-dimensional material layer 50 may be formed as a flat bottom contact structure.

A structure in which the planarization layer 15 burying the metal layer 20 so that the upper surface of the metal layer 20 is exposed is applied may be formed in the following manner according to a material forming the metal layer 20.

For example, when a metal capable of a planarization process, for example, a chemical mechanical polishing (CMP) process, such as a slurry, is used, in a state in which the planarization layer 15 is formed on the substrate 11 and a trench is previously deeply formed in a region where the metal layer 20 is to be formed, a thick metal is deposited on the entire surface of the trench and then planarized by the planarization process, for example, the CMP process, and thus the structure in which the planarization layer 15 burying the metal layer 20 is applied so that the upper surface of the metal layer 20 is exposed without an air gap may be formed.

As another example, when a metal incapable of the planarization process, for example, the CMP process, such as a noble metal, is used, the planarization layer 15 is formed on the substrate 11, and a trench is shallowly formed to have various inclinations in a region in which the metal layer 20 is to be formed, and thus the structure in which the planarization layer 15 burying the metal layer 20 so that the upper surface of the metal layer 20 is exposed is applied may be formed through a lift-off process in which the metal is deposited only up to the height of the trench.

The two-dimensional material layer 50 may be formed in a flat bottom contact structure, by forming the insertion layer 30 on the metal layer 20 of the planarized structure as formed above, and transferring the two-dimensional material layer 50 on the planarized structure.

The electronic devices 1 and 10 having the above-described structure may be implemented as field effect transistors of various types, as shown in FIGS. 5 and 9 to 11.

According to electronic devices 100, 200, 300, 400, and 500 according to embodiments shown in FIGS. 5 and 9 to 12, a field effect transistor having a low contact barrier between a two-dimensional material and a metal may be implemented, by introducing a lower electrode structure in which the insertion layer 30 is present.

Figure 5:
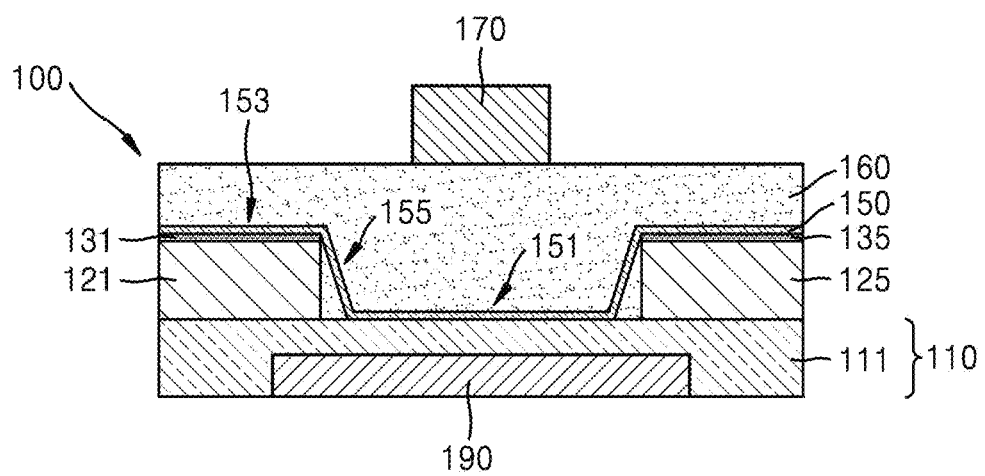
FIG. 5 is a cross-sectional view schematically showing an electronic device according to another embodiment.

FIG. 5 is a cross-sectional view schematically showing the electronic device 100 according to another embodiment, and shows an example implemented as a field effect transistor.

Referring to FIG. 5, the electronic device 100 according to an embodiment includes first and second electrodes 121 and 125 provided on a substrate 110 to be spaced apart from each other, a two-dimensional material layer 150, and insertion layers 131 and 135 between the first and second electrodes 121 and 125 and the two-dimensional material layer 150. The two-dimensional material layer 150 may be provided to cover upper surfaces of the first and second electrodes 121 and 125 and an upper surface of the substrate 110 between the first and second electrodes 121 and 125. The electronic device 100 according to an embodiment may further include a gate insulating layer 160 formed on the two-dimensional material layer 150. In addition, the electronic device 100 according to an embodiment may further include a gate electrode 170 on the gate insulating layer 160. In addition, the electronic device 100 according to an embodiment may further include a lower gate electrode 190. Here, the electronic device 100 according to an embodiment may include only the gate electrode 170 without the lower gate electrode 190. Also, the electronic device 100 according to an embodiment may include only the lower gate electrode 190 without the gate insulating layer 160 and the gate electrode 170.

The substrate 110 may be an insulating substrate, or a substrate having an insulating layer 111 formed thereon. For example, the substrate 110 may include the insulating layer 111 including a non-metal material such as silicon oxide, aluminum oxide, or hafnium oxide. Also, the substrate 110 may include a semiconductor substrate. In this regard, the semiconductor substrate may include, for example, Si, Ge, SiGe, or an III-V group semiconductor material. For example, the substrate 110 may be a semiconductor substrate having the insulating layer 111 formed on the surface thereof. The substrate 110 may be, for example, a silicon substrate having silicon oxide formed on the surface thereof, but is not limited thereto.

FIG. 5 shows an example in which the substrate 110 includes the insulating layer 111 and the lower gate electrode 190 is buried in the insulating layer 111 so that the lower gate electrode 190 corresponds to a channel region.

The first and second electrodes 121 and 125 may include a metal material having excellent electrical conductivity, and may be formed on the substrate 110 to be spaced apart from each other. Any one of the first and second electrodes 121 and 125 may be a source electrode, and the other may be a drain electrode.

The first and second electrodes 121 and 125 may be formed of the metal layer 20 described above. The first and second electrodes 121 and 125 may include, for example, a noble metal or a metal having a low work function. The first and second electrodes 121 and 125 may include, for example, the noble metal such as Au, Ag, Ru, Pd, or Pt. In addition, the first and second electrodes 121 and 125 may include the metal having the low work function, such as Ti, Al, In, or Sc. In addition, the first and second electrodes 121 and 125 may include various metals capable of being processed in a glove box or in a vacuum. Oxidation of the first and second electrodes 121 and 125 may be limited and/or prevented, by providing the insertion layers 131 and 135 on the first and second electrodes 121 and 125, respectively, so that the first and second electrodes 121 and 125 may have more options for selection of metal materials, and various types of metal may be applied to the first and second electrodes 121 and 125. That is, not only the noble metal, but also the metal having the low work function, such as Ti, Al, In, Sc, etc., having relatively strong oxidizing properties may be applied to the first and second electrodes 121 and 125.

As shown in FIG. 5, the first and second electrodes 121 and 125 may be spaced apart from each other on the substrate 110 to have a step with respect to a reference surface. The reference surface may correspond to the upper surface of the substrate 110. That is, the first and second electrodes 121 and 125 may be formed to be spaced apart from each other on the substrate 110 and protrude from the surface of the substrate 110.

As shown in FIG. 5, when the first and second electrodes 121 and 125 are formed to be spaced apart from each other on the substrate 110 and protrude from the surface of the substrate 110, the first and second electrodes 121 and 125 may be formed to have a thickness, for example, equal to or greater than about 50 nm so that a strain may be applied to the two-dimensional material layer 150 provided to cover the upper surfaces of the first and second electrodes 121 and 125 and the upper surface of the substrate 110 between the first and second electrodes 121 and 125.

The insertion layers 131 and 135 may be formed on the first and second electrodes 121 and 125 respectively. The insertion layers 131 and 135 may be anti-oxidation layers that limit and/or prevent oxidation of the surfaces of the first and second electrodes 121 and 125 respectively. As shown in FIG. 5, when the first and second electrodes 121 and 125 protrude to be spaced apart from each other on the substrate 110, the insertion layers 131 and 135 may be respectively formed on the first and second electrodes 121 and 125 that protrude.

The insertion layers 131 and 135 may be formed of a material that maintains or lowers the work function of the first and second electrodes 121 and 125 formed thereunder. The insertion layers 131 and 135 may reduce a barrier by controlling the work function, and may lower a contact resistance by limiting and/or preventing the oxidation of surfaces of the first and second electrodes 121 and 125.

The insertion layers 131 and 135 may include, for example, any one material selected from graphene, amorphous carbon (a-C), h-BN, and a-BN, or may include various other barrier materials. The insertion layers 131 and 135 may be formed to have a thickness of about 5 nm or less, for example, about 3 nm or less. The insertion layers 131 and 135 may be directly grown on the first and second electrodes 121 and 125 respectively by a deposition process. The insertion layers 131 and 135 may be directly deposited on the surfaces of the first and second electrodes 121 and 125, respectively, for example, through an in-situ deposition after deposition of the first and second electrodes 121 and 125. As described above, when the insertion layers 131 and 135 are formed through the in-situ deposition after the deposition of the first and second electrodes 121 and 125, the oxidation of surfaces of the first and second electrodes 121 and 125 may be reduced and/or minimized. For example, when the insertion layers 131 and 135 are formed by directly depositing, for example, graphene on the surfaces of the first and second electrodes 121 and 125 through the in-situ deposition after the deposition of the first and second electrodes 121 and 125, the oxidation of the surfaces of the first and second electrodes 121 and 125 may be reduced and/or minimized. Here, when the insertion layers 131 and 135 are formed through the in-situ deposition after the deposition of the first and second electrodes 121 and 125, the oxidation of the first and second electrodes 121 and 125 may be reduced and/or minimized, but the embodiment is not limited thereto. For example, when the first and second electrodes 121 and 125 are formed of a noble metal, the insertion layers 131 and 135 may be formed through the in-situ deposition after the deposition of the first and second electrodes 121 and 125, or through other deposition methods than the in-situ deposition. For example, the insertion layers 131 and 135 may be formed by transferring a single layer or several layers of graphene (e.g., 3 or less, 5 or less, or 10 or less) onto the surfaces of the first and second electrodes 121 and 125.

The two-dimensional material layer 150 may form a channel layer. The two-dimensional material layer 150 may be formed to cover the upper surfaces of the first and second electrodes 121 and 125 and the upper surface of the substrate 110 between the first and second electrodes 121 and 125 by the transfer process.

For example, the first and second electrodes 121 and 125 may be formed on the substrate 110 to be spaced apart from each other, by depositing a metal layer forming the first and second electrodes 121 and 125 on the substrate 110 and patterning the metal layer. The insertion layers 131 and 135 may be respectively formed on the first and second electrodes 121 and 125, and the two-dimensional material layer 150 may be formed over the upper surfaces of the first and second electrodes 121 and 125 and the upper surface of the substrate 110 between the first and second electrodes 121 and 125 by the transfer process.

For another example, the first and second electrodes 121 and 125 respectively having the insertion layers 131 and 135 on their surfaces to be spaced apart from each other may be formed on the substrate 110, by depositing a metal layer on the substrate 110, and, before patterning, forming the insertion layers 131 and 135 on positions of the metal layer where the first and second electrodes 121 and 125 are to be formed, and then patterning the metal layer. In addition, the two-dimensional material layer 150 may be formed over the upper surfaces of the first and second electrodes 121 and 125 and the upper surface of the substrate 110 between the first and second electrodes 121 and 125 by the transfer process.

The two-dimensional material layer 150 may be a channel layer, and a portion positioned between the first and second electrodes 121 and 125 may correspond to a channel region. For example, as shown in FIG. 5, when the first and second electrodes 121 and 125 are formed to have a step with respect to a reference surface, that is, protrude from the surface of the substrate 110, the two-dimensional material layer 150 may include a first portion 151 positioned along the reference surface, a second portion 155 positioned on the first and second electrodes 121 and 125 with the insertion layers 131 and 135 interposed therebetween, and an inclined third portion 153 between the first and second portions 151 and 155. The first portion 151 positioned along the reference surface, for example, the surface of the substrate 110, may correspond to the channel region. Since the first and second electrodes 121 and 125 protrude from the substrate 110, the third portion 153 may be suspended.

Since the first and second electrodes 121 and 125 protrude from the substrate 110, when the two-dimensional material layer 150 is formed over the upper surfaces of the first and second electrodes 121 and 125 and the upper surface of the substrate 110 between the first and second electrodes 121 and 125 by the transfer process, a strain is additionally applied to the third portion 153, that is, the suspended portion, and, as described with reference to FIG. 2, an energy barrier, that is, the Schottky barrier, generated at a junction of a metal- two-dimensional material (semiconductor) may be lowered by the strain, and a bandgap may also be narrowed.

That is, Fermi level de-pinning may be induced, by forming the two-dimensional material layer 150 in the structure in bottom contact with the first and second electrodes 121 and 125, and thus contact barrier lowering may be obtained. In addition, a tensile strain is additionally applied to the two-dimensional material layer 150 suspended by a step between the first and second electrodes 121 and 125 and the upper surface of the substrate 11, and thus band gap narrowing may be obtained, thereby further lowering the Schottky barrier. In addition, the two-dimensional material layer 150 may be formed by the transfer process, by forming the two-dimensional material layer 50 in the structure in bottom contact with the metal layer, and thus, a large-area integration process is possible.

In the electronic device 100 according to an embodiment, the two-dimensional material layer 150 may include at least one transferable two-dimensional material selected from all types of transferable two-dimensional materials. In addition, the two-dimensional material layer 150 may include a transferable two-dimensional material exhibiting a characteristic of a semiconductor material. As described above, the two-dimensional material layer 150 may include at least one of, for example, graphene, black phosphorous, or TMD. The TMD may include a compound of a transition metal and a chalcogen element. For example, the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, etc. but is not limited thereto.

The gate insulating layer 160 may be positioned between the two-dimensional material layer 150 and the gate electrode 170, and the gate electrode 170 may be formed on the gate insulating layer 160 so that the gate electrode 170 corresponds to the channel region of the two-dimensional material layer 150.

The gate insulating layer 160 may include at least one of a high-k oxide, silicon oxide, and a two-dimensional insulating material capable of atomic layer deposition (ALD). The gate insulating layer 160 may include, for example, aluminum oxide, hafnium oxide, zirconium hafnium oxide, lanthanum oxide, etc. as the high-k oxide. The gate insulating layer 160 may include, for example, h-BN as the two-dimensional insulating material. However, the embodiment is not limited thereto.

The gate electrode 170 may include a metal material or a conductive oxide. Here, the metal material may include, for example, at least one selected from the group consisting of Au, Ti, TiN, TaN, W, Mo, WN, Pt, and Ni. The conductive oxide may include, for example, indium tin oxide (ITO), indium zinc oxide (IZO), etc. The gate electrode 170 may include the same material as a source electrode and a drain electrode.

Meanwhile, FIG. 5 shows the electronic device 100 according to an embodiment further including the lower gate electrode 190, but this is merely an example, and the electronic device 100 according to an embodiment may include only the gate electrode 17 without the lower gate electrode 190. For another example, the electronic device 100 according to an embodiment may include only the lower gate electrode 190 without the gate electrode 170.

The lower gate electrode 190, like the gate electrode 170, may include a metal material or a conductive oxide. Here, the metal material may include, for example, at least one selected from the group consisting of Au, Ti, TiN, TaN, W, Mo, WN, Pt, and Ni. The conductive oxide may include, for example, ITO, IZO, etc. The lower gate electrode 190 may include the same material as the source electrode and the drain electrode. Also, the lower gate electrode 190 may include the same material as or a different material from the gate electrode 170.

The electronic device 100 according to an embodiment may be manufactured, for example, as follows. The first and second electrodes 121 and 125 spaced apart from each other and protruding from the substrate 110 may be formed, by forming a metal layer on the substrate 110 and patterning the metal layer. In addition, the insertion layers 131 and 135 may be respectively formed on the first and second electrodes 121 and 125 through, for example, an in-situ process. Next, a two-dimensional material layer may be transferred and formed in a contact structure without chemical bonding with the first and second electrodes 121 and 125. In this regard, the two-dimensional material layer may be suspended by the first and second electrodes 121 and 125 protruding from the substrate 110 during a transfer process, and an additional strain may be applied thereto. After the two-dimensional material layer is formed by the transfer process as described above, an oxide used as the gate insulating layer 160, for example, a high-k oxide, may be deposited by, for example, an ALD process. In addition, the gate electrode 170 including a metal material may be formed on the gate insulating layer 160.

Figure 6:
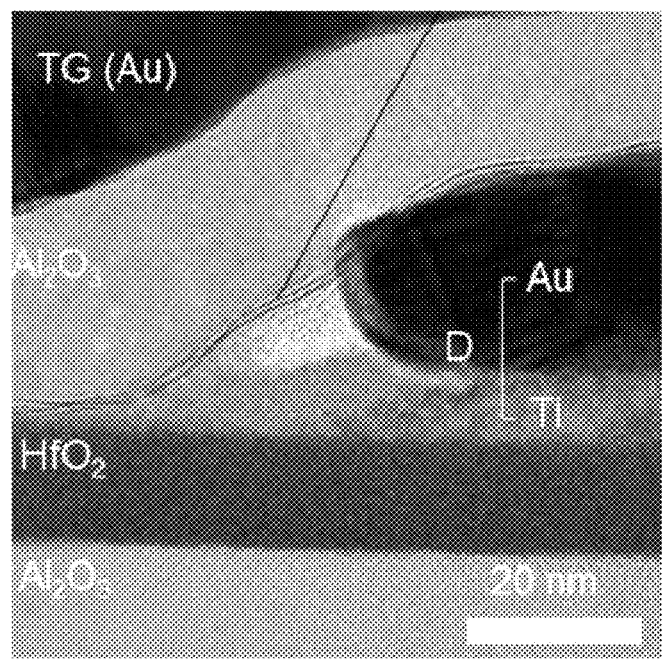
FIG. 6 shows a transmission electron microscopy (TEM) image when a two-dimensional material layer including $MoS_2$ is formed over a protruding electrode by a transfer process.

FIG. 6 shows a transmission electron microscopy (TEM) image when the two-dimensional material layer 150 including $MoS_2$ is formed over a protruding electrode by a transfer process. Referring to FIG. 6, when the two-dimensional material layer 150 including $MoS_2$ is formed over the protruding electrode by the transfer process, it may be observed that the two-dimensional material layer 150 including $MoS_2$ rises well on the electrode without being damaged and is well suspended without breaking even by a strain applied during the transfer process.

Figure 7:
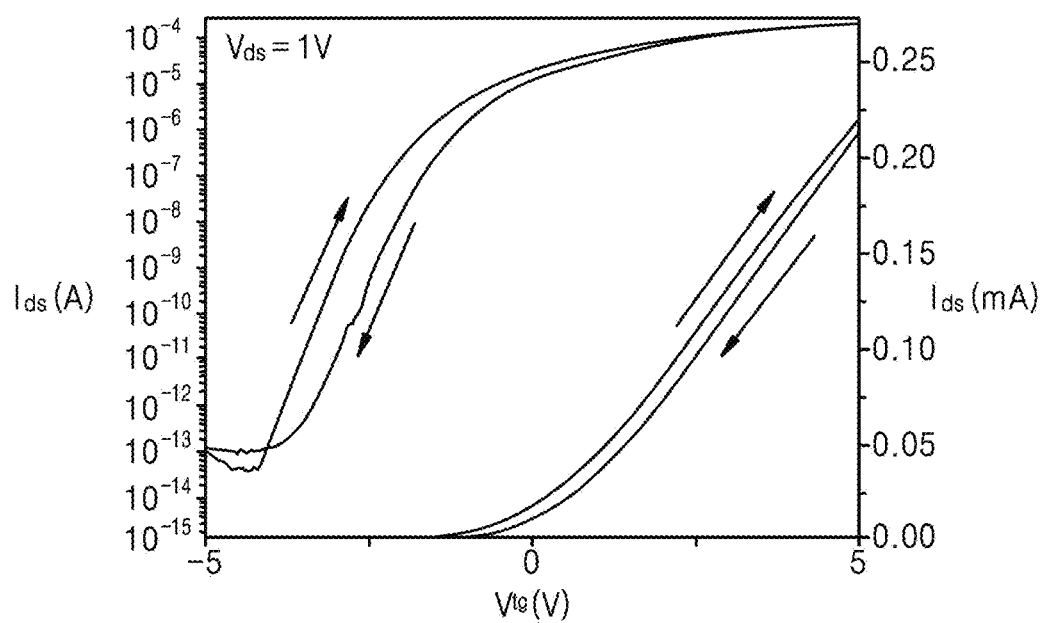
FIG. 7 is a graph showing voltage-current transfer characteristics when an electronic device according to an embodiment is implemented as a field effect transistor including a bottom contact structure of a two-dimensional material layer including $MoS_2$.
Figure 8:
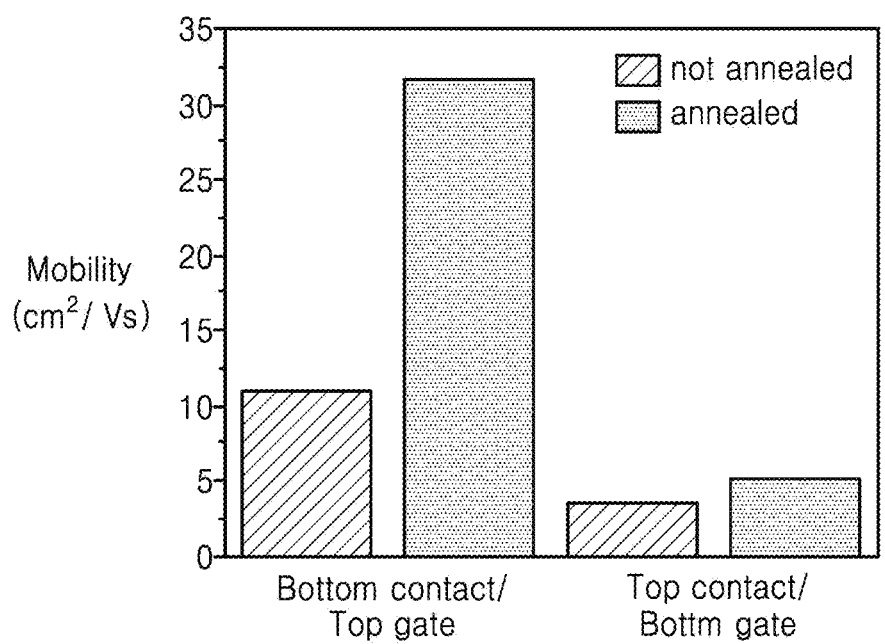
FIG. 8 shows a comparison of mobility between a sample of an embodiment including a lower contact/upper gate and a sample of a comparative example including an upper contact/lower gate.

FIG. 7 is a graph showing voltage-current transfer characteristics when the electronic device 100 according to an embodiment is implemented as a field effect transistor including a bottom contact structure of the two-dimensional material layer 150 including $MoS_2$. FIG. 8 shows a comparison of mobility between a sample of an embodiment including a lower contact/upper gate and a sample of a comparative example including an upper contact/lower gate.

As may be seen from FIGS. 7 and 8, an on/off ratio is up to $10^9$ and the mobility is up to about 30 $cm^2/Vs$, making it possible to implement the field effect transistor including the lower contact/upper gate having excellent characteristics.

In the electronic device 100 according to an embodiment, since the two-dimensional material layer 150 is formed in the structure in bottom contact with the first and second electrodes 121 and 125, a junction of a metal-two-dimensional material (semiconductor) without chemical bonding may be formed by transferring the two-dimensional material layer 150 onto the patterned first and second electrodes 121 and 125, and accordingly, the Fermi level pinning phenomenon may be reduced and/or minimized. That is, in the electronic device 100 according to an embodiment, the Fermi level pinning phenomenon that generates an energy barrier on a surface of the two-dimensional material layer 150 at the junction of the metal-two-dimensional material (semiconductor) may be limited and/or prevented.

In addition, in the electronic device 100 according to an embodiment, by providing the insertion layers 131 and 135 between the two-dimensional material layer 150 and the first and second electrodes 121 and 125, a barrier may be lowered by controlling a work function, and a contact resistance may be lowered by limiting and/or preventing oxidation of surfaces of the first and second electrodes 121 and 125.

Therefore, in the electronic device 100 according to an embodiment, a contact barrier, for example, a Schottky barrier, at a junction of the first and second electrodes 121 and 125 and the two-dimensional material layer 150 may be lowered.

In addition, in the electronic device 100 according to an embodiment, by forming the first and second electrodes 121 and 125 to have a step with respect to a reference surface, for example, the surface of the substrate 110, when the two-dimensional material layer 50 is formed over the first and second electrodes 121 and 125 and the upper surface of the substrate 11 by the transfer process, the two-dimensional material layer 50 is suspended at a step portion, whereby the strain may be additionally applied to the suspended portion of the two-dimensional material layer 50. By the additionally applied strain, as described with reference to FIG. 2, the energy barrier, that is, the Schottky barrier, generated on the surface of the two-dimensional material layer 150 at the junction of the metal-two-dimensional material (semiconductor) may be further lowered, and the bandgap may also be narrowed, and thus the contact barrier at the junction of the first and second electrodes 121 and 125 and the two-dimensional material layer 150 may be additionally lowered.

Figure 9:
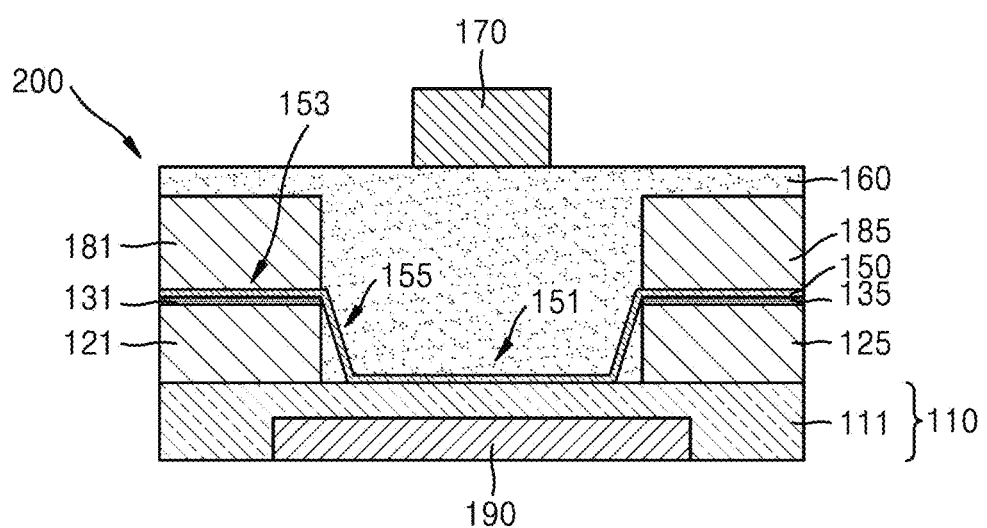
FIGS. 9 to 12 are cross-sectional views schematically showing electronic devices according to embodiments, and show examples implemented as field effect transistors.

FIG. 9 is a cross-sectional view schematically showing the electronic device 200 according to an embodiment, and shows an example implemented as a field effect transistor. The electronic device 200 shown in FIG. 9 is different from FIG. 5 in that the electronic device 200 further includes first and second upper electrodes 181 and 185 on the two-dimensional material layer 150 so that the first and second upper electrodes 181 and 185 respectively correspond to the first and second electrodes 121 and 125.

As described above, in addition to the first and second electrodes 121 and 125, when the first and second upper electrodes 181 and 185 are added on the two-dimensional material layer 150 to correspond to the first and second electrodes 121 and 125, a double-sided contact structure with the two-dimensional material layer 150 is implemented, which may increase a charge injection path, and thus the contact resistance may be further lowered.

Figure 10:
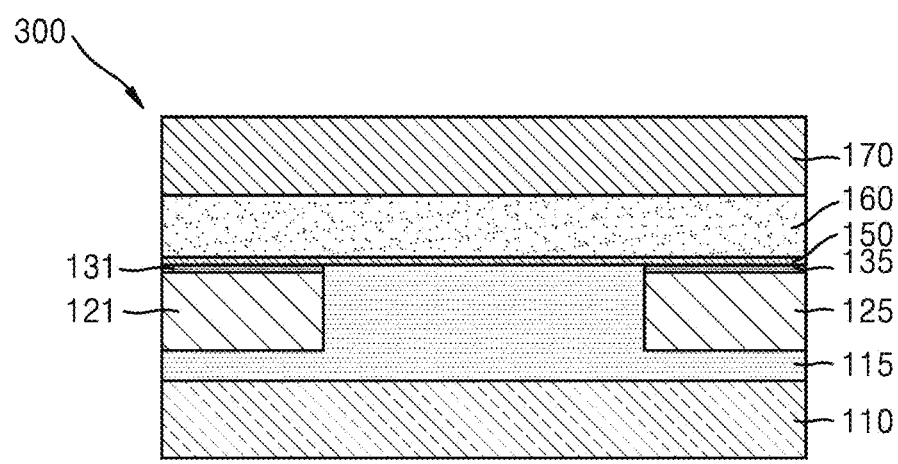

FIG. 10 is a cross-sectional view schematically showing the electronic device 300 according to an embodiment, and shows an example implemented as a field effect transistor.

Referring to FIG. 10, the electronic device 300 according to an embodiment may include the first and second electrodes 121 and 125 formed on the substrate 110 to be spaced from each other, a planarization layer 115 formed on the substrate 110 to bury the first and second electrodes 121 and 125 so that upper surfaces of the first and second electrodes 121 and 125 are exposed, the insertion layers 131 and 135 respectively formed on the first and second electrodes 121 and 125, and the two-dimensional material layer 150 provided flatly over the first and second electrodes 121 and 125 in which the insertion layers 131 and 135 are respectively formed and the planarization layer 115. The same reference numeral as in FIG. 5 denotes substantially the same configuration, and thus a repetitive description thereof is omitted herein.

The planarization layer 115 may include an insulating material, for example, silicon oxide. As shown in FIG. 10, the two-dimensional material layer 150 may be formed in a structure in bottom contact with the first and second electrodes 121 and 125 and without additional strain application, by applying the planarization layer 115 burying the first and second electrodes 121 and 125 so that the upper surfaces of the first and second electrodes 121 and 125 are exposed, and forming flatly the two-dimensional material layer 150 over the first and second electrodes 121 and 125 in which the insertion layers 131 and 135 are respectively formed and the planarization layer 115 by a transfer process.

As shown in FIG. 10, when the planarization layer 115 burying the first and second electrodes 121 and 125 so that the upper surfaces of the first and second electrodes 121 and 125 are exposed is applied, the two-dimensional material layer 150 may be formed in the structure in bottom contact with the first and second electrodes 121 and 125, even if a two-dimensional material that is easily broken by strain during the transfer process is applied as the two-dimensional material layer 150.

As shown in FIG. 10, when the planarization layer 115 burying the first and second electrodes 121 and 125 so that the upper surfaces of the first and second electrodes 121 and 125 are exposed is applied, the two-dimensional material layer 150 may be formed in a flat bottom contact structure.

A structure in which the planarization layer 115 burying the first and second electrodes 121 and 125 so that the upper surfaces of the first and second electrodes 121 and 125 are exposed is applied may be formed in the following manner according to materials forming the first and second electrodes 121 and 125.

For example, when a metal capable of a planarization process, for example, a CMP process, such as a slurry, is used, in a state in which the planarization layer 115 is formed on the substrate 110 and a trench is previously deeply formed in a region where the first and second electrodes 121 and 125 is to be formed, a thick metal is deposited on the entire surface of the trench and then planarized by the planarization process, for example, the CMP process, and thus the structure in which the planarization layer 115 burying the first and second electrodes 121 and 125 is applied so that the upper surfaces of the first and second electrodes 121 and 125 are exposed without an air gap may be formed.

As another example, when a metal incapable of the planarization process, for example, the CMP process, such as a noble metal, is used, the planarization layer 115 is formed on the substrate 110, and a trench is shallowly formed to have various inclinations in a region in which the first and second electrodes 121 and 125 is to be formed, and thus the structure in which the planarization layer 115 burying the first and second electrodes 121 and 125 so that the upper surfaces of the first and second electrodes 121 and 125 are exposed is applied may be formed through a lift-off process in which the metal is deposited only up to the height of the trench.

The two-dimensional material layer 150 may be formed in a flat bottom contact structure, by forming the insertion layers 131 and 135 on the first and second electrodes 121 and 125 of the planarized structure as formed above, and transferring the two-dimensional material layer 150 on the planarized structure.

Even when the two-dimensional material layer 150 is provided over the first and second electrodes 121 and 125 and the planarization layer 115 as in FIG. 10, since the two-dimensional material layer 150 is formed in the structure in bottom contact with the first and second electrodes 121 and 125, a junction of a metal-two-dimensional material (semiconductor) without chemical bonding may be formed by transferring the two-dimensional material layer 150 onto the first and second electrodes 121 and 125, and accordingly, the Fermi level pinning phenomenon may be reduced and/or minimized. In addition, a barrier may be lowered by controlling a work function, by providing the insertion layers 131 and 135 between the two-dimensional material layer 150 and the first and second electrodes 121 and 125, and a contact resistance may be lowered by limiting and/or preventing oxidation of the first and second electrodes 121 and 125.

Therefore, even when the two-dimensional material layer 150 is formed in the flat bottom contact structure, a contact barrier, for example, a Schottky barrier, at the junction of the metal-two-dimensional material (semiconductor) may be lowered.

Figure 11:
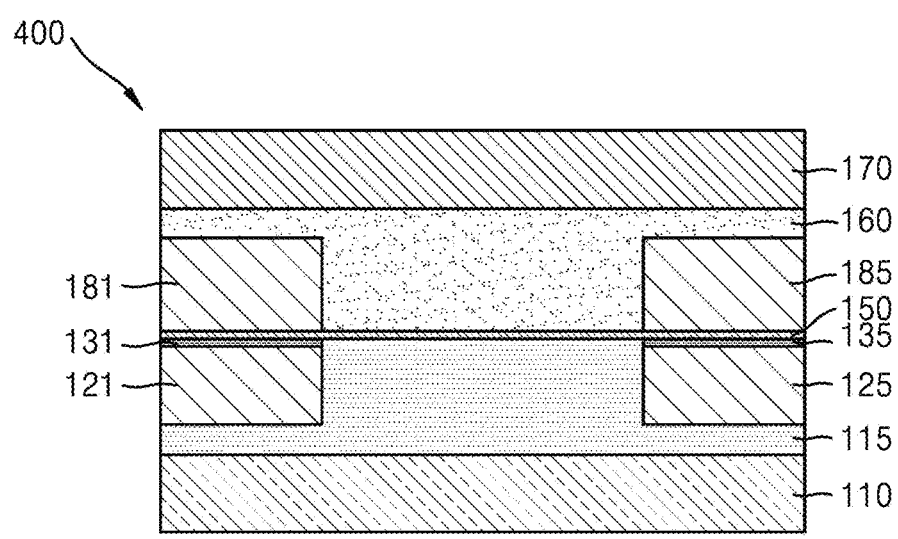

FIG. 11 is a cross-sectional view schematically showing the electronic device 400 according to an embodiment, and shows an example implemented as a field effect transistor. The electronic device 400 shown in FIG. 11 is different from FIG. 10 in that the electronic device 400 further includes the first and second upper electrodes 181 and 185 on the two-dimensional material layer 150 so that the first and second upper electrodes 181 and 185 respectively correspond to the first and second electrodes 121 and 125. As described above, in addition to the first and second electrodes 121 and 125, when the first and second upper electrodes 181 and 185 are added on the two-dimensional material layer 150 to correspond to the first and second electrodes 121 and 125, a double-sided contact structure with the two-dimensional material layer 150 is implemented, which may increase a charge injection path, and thus the contact resistance may be further lowered.

While the electronic devices 100, 200, 300, and 400 described above with reference to FIGS. 5, 9, 10, and 11 have been described as examples where the first and second electrodes 121 and 125 have a same size, example embodiments are not limited thereto.

Figure 12:
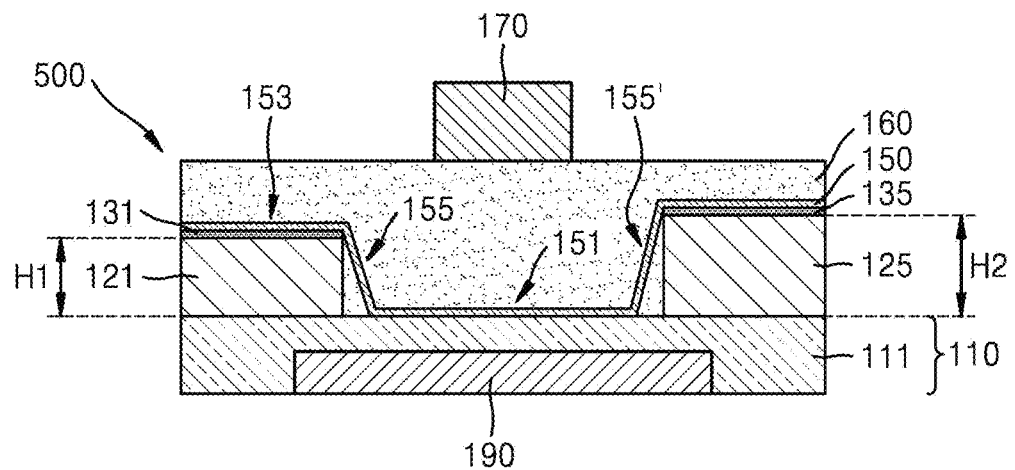

For example, FIG. 12 shows an electronic device 500 that is the same as the electronic device 100 in FIG. 5, except the height H1 of the first electrode 121 may be different than the height H2 of the second electrode 125. The height H1 of the first electrode 121 may be less than the height H2 of the second electrode 125. Due to the different heights H1 and H2 of the first electrode 121 and the second electrode 125, the strain of the inclined second portion 155 of the graphene 150 near the first electrode 121 may be different than the strain of the inclined portion 155' near the second electrode 125. An energy barrier of the graphene 150 on the first electrode 121 may be adjusted differently than an energy of the graphene 150 on the second electrode 125 by applying different strains to the inclined second portion 155 and inclined portion 155' of the graphene 150.

While some embodiments in which electronic devices 100, 200, 300, 400, and 500 having the structure in which the two-dimensional material layer 150 is in bottom contact with a metal layer are implemented as field effect transistors have been described and illustrated above, the presented embodiments are merely examples and inventive concepts are not limited thereto.

The electronic devices 1, 10, 100, 200, 300, 400, and 500 according to example embodiments may be implemented as various devices that may be required to lower a contact barrier by forming the two-dimensional material layer 150 in a structure in bottom contact with the metal layer. While embodiments have been described above with reference to the drawings, the embodiments are merely examples, and various modifications to the embodiments may be possible.

In electronic devices according to example embodiments, a contact barrier, for example, a Schottky barrier, at a junction of a metal-two-dimensional material (semiconductor) may be lowered, by forming a two-dimensional material layer in a structure in bottom contact with a metal. In addition, in electronic devices according to example embodiments, by providing an insertion layer between a metal layer (an electrode) and the two-dimensional material layer, a barrier may be lowered by controlling a work function, and a contact resistance may be lowered by limiting and/or preventing oxidation of the metal layer.

Figure 13:
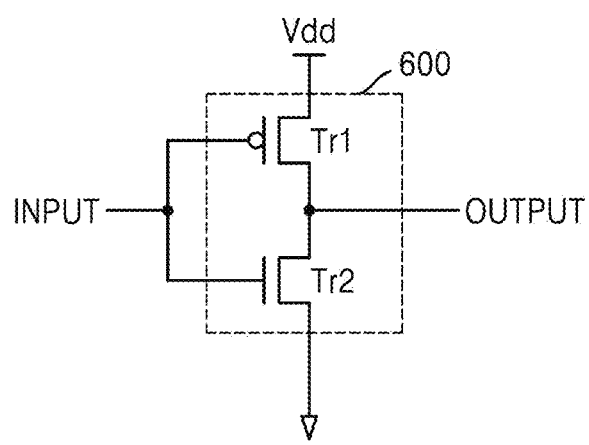
FIG. 13 is a circuit diagram of an electronic device according to an example embodiment.

FIG. 13 is a circuit diagram of an electronic device according to an example embodiment.

Referring to FIG. 13, an electronic circuit 600 according to an embodiment may include a first transistor Tr1 and a second transistor Tr2 between a power terminal Vdd and a ground terminal. An input line may be configured to apply a voltage to the gates of the first transistor Tr1 and a second transistor Tr2. An output line may be connected to a node between the first transistor Tr1 and the second transistor Tr2. The electronic circuit 600 may include one of the electronic devices 100, 200 300, 400, and 500 described above as the first transistor Tr1 or second transistor Tr2.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
   a substrate;
   a metal layer on a partial region of the substrate;
   a two-dimensional material layer over the metal layer and an upper surface of the substrate; and
   an insertion layer between the metal layer and the two-dimensional material layer, wherein
   the two-dimensional material layer directly contacts a first surface of the insertion layer,
   a second surface of the insertion layer directly contacts the metal layer,
   the second surface of the insertion layer is opposite the first surface of the insertion layer, and
   the two-dimensional material layer extends over a region of the upper surface of the substrate that is not covered by the metal layer.

2. The electronic device of claim 1, wherein the two-dimensional material layer comprises a transferable two-dimensional material.

3. The electronic device of claim 1, wherein the two-dimensional material layer comprises at least one of graphene, black phosphorus, or transition metal dichalcogenide (TMD).

4. The electronic device of claim 1, wherein the metal layer comprises a metal having a low work function or a noble metal.

5. The electronic device of claim 4, wherein the insertion layer comprises graphene, a-C, h-BN, or a-BN.

6. The electronic device of claim 1, wherein the insertion layer comprises graphene, a-C, h-BN, or a-BN.

7. The electronic device of claim 1, wherein the metal layer has a step with respect to a reference surface, and
   wherein the two-dimensional material layer comprises a first portion along the reference surface, a second portion on the metal layer; and
   an inclined third portion between the first portion and the second portion.

8. The electronic device of claim 7, wherein the two-dimensional material layer comprises a transferred two-dimensional material layer, and
   wherein the inclined third portion corresponds to a suspended portion.

9. The electronic device of claim 7, further comprising:
   an upper metal layer on the two-dimensional material layer,
   wherein the upper metal layer corresponds to the metal layer.

10. The electronic device of claim 1, further comprising:
    a planarization layer on the substrate, the planarization layer exposing an upper surface of the metal layer,
    wherein the two-dimensional material layer extends over the metal layer and the planarization layer.

11. The electronic device of claim 10, further comprising:
    an upper metal layer on the two-dimensional material layer, wherein the upper metal layer corresponds to the metal layer.

12. The electronic device of claim 1,
wherein the metal layer comprises a first electrode and a second electrode spaced apart from each other on an upper surface of the substrate,
wherein the two-dimensional material layer contacts an upper surface of the first electrode, two-dimensional material layer contacts an upper surface of the second electrode, and covers an upper surface of a part of the substrate between the first electrode and the second electrode,
the part of the substrate between the first electrode and the second electrode is the region of the substrate not covered by the metal layer.

13. The electronic device of claim 12, further comprising:
a gate insulating layer on the two-dimensional layer; and
a gate electrode on the gate insulating layer, wherein
the two-dimensional material layer is a channel layer.

14. The electronic device of claim 13,
wherein the gate insulating layer comprises at least one of a high-k oxide, a silicon oxide, or a two-dimensional insulating material capable of atomic layer deposition (ALD).

15. An electronic device comprising:
a substrate;
a metal layer on a partial region of the substrate;
a two-dimensional material layer over the metal layer and an upper surface of the substrate; and
an insertion layer between the metal layer and the two-dimensional material layer,
wherein the metal layer comprises a first electrode and a second electrode spaced apart from each other on the substrate, and
wherein the two-dimensional material layer covers an upper surface of the first electrode, an upper surface of the second electrode, and an upper surface of a part of the substrate between the first electrode and the second electrode.

16. The electronic device of claim 15, further comprising:
a gate insulating layer on the two-dimensional material layer; and
a gate electrode on the gate insulating layer, wherein
the two-dimensional material layer is a channel layer.

17. The electronic device of claim 16,
wherein the gate insulating layer comprises at least one of a high-k oxide, a silicon oxide, or a two-dimensional insulating material capable of atomic layer deposition (ALD).

18. The electronic device of claim 15,
the two-dimensional layer extends over a region of the upper surface of the substrate that is not covered by the metal layer,
the part of the substrate between the first electrode and the second electrode is the region of the substrate not covered by the metal layer,
the two-dimensional material layer contacts the upper surface of the first electrode, the two-dimensional dimensional material layer contacts the upper surface of the second electrode, and
the upper surface of the first electrode and the upper surface of the second electrode are parallel to each other.

* * * * *